United States Patent [19]

French

[11] Patent Number: 5,272,370
[45] Date of Patent: Dec. 21, 1993

[54] THIN-FILM ROM DEVICES AND THEIR MANUFACTURE

[75] Inventor: Ian D. French, Brighton, England

[73] Assignee: U.S. Philips Corporation, New York, N.Y.

[21] Appl. No.: 902,636

[22] Filed: Jun. 23, 1992

[30] Foreign Application Priority Data

Jun. 26, 1991 [GB] United Kingdom ............... 9113795

[51] Int. Cl.$^5$ .................... H01L 45/00; G11C 17/06
[52] U.S. Cl. ..................... 257/353; 257/478; 257/486; 365/103; 365/105
[58] Field of Search ............. 365/103, 105, 45; 257/314, 353, 478, 486

[56] References Cited

U.S. PATENT DOCUMENTS

| | | | |
|---|---|---|---|
| 4,229,755 | 10/1980 | Custode | 257/315 |
| 4,233,671 | 11/1980 | Gerzberg et al. | 365/105 |
| 4,462,088 | 6/1984 | Giulilani et al. | 365/105 |
| 4,727,409 | 2/1988 | Conner et al. | 365/105 |
| 5,060,034 | 10/1991 | Shimizu et al. | 257/314 |
| 5,101,249 | 3/1992 | Hijiya et al. | 257/314 |

FOREIGN PATENT DOCUMENTS

2066566  7/1981  United Kingdom .

Primary Examiner—Rolf Hille
Assistant Examiner—Mahshid Saadat
Attorney, Agent, or Firm—Steven R. Biren

[57] ABSTRACT

A thin-film ROM device includes an array of open circuit and closed-circuit cells (5 to 8) formed from a stack of thin films (12,21,22,23,11) on a glass or other substrate (10). The semiconductor films (21,22,23) may be of hydrogenated amorphous silicon. At least one of the semiconductor films (21,22,23) is removed from some of the closed-circuit cell areas (5,7,8) before depositing the next film. In this way, at least a second type of thin-film diode (MIM, MIN, MIP) is formed having a different conduction characteristic to that of a first type (NIP), so increasing the information content of the ROM array. A lower semiconductor film (23) can be readily etched away from the lower electrode film (11) by a selective etching treatment in which the electrode film (11) acts as an etch stop. By monitoring emissions during plasma etching, an upper semiconductor film (21 or 22) can be removed from a lower semiconductor film (22 or 23). PN diodes and back-to-back PNP or NPN or PINIP or NIPIN diodes may be formed for some of the closed-circuit cells.

7 Claims, 3 Drawing Sheets

THIN-FILM ROM DEVICES AND THEIR MANUFACTURE

BACKGROUND OF THE INVENTION

This invention relates to thin-film read-only memory (ROM) devices comprising an array of open-circuit and closed-circuit cells formed on a substrate, each closed-circuit cell comprising a thin-film diode, particularly but not exclusively with one or more films of hydrogenated amorphous silicon. The invention also relates to advantageous methods for the manufacture of such thin-film ROM devices.

Published United Kingdom patent application GB-A-2 066 566 discloses a thin-film ROM device comprising an array of open-circuit and closed-circuit cells formed on a substrate, each closed-circuit cell comprising a thin-film diode; the array is formed from a stack of thin films carried on the substrate and including at least lower and upper semiconductor films of different conductivity type and/or conductivity between lower and upper electrode films.

The semiconductor films in the diodes of GB-A-2 066 566 are of hydrogenated amorphous silicon containing fluorine and have opposite conductivity type dopings so as to form PN junction diodes. An alternative ROM device is described in GB-A-2 066 566, in which (instead of a PN junction diode) all the closed-circuit cells comprise a Schottky diode formed between an upper metal-based electrode film and an underlying semiconductor film. An electrically erasable programmable read-only memory (EEPROM) is also described in GB-A-2 066 566, in which a thin film of reversible phase-change amorphous material is included between an upper electrode film and an underlying semiconductor film in all the closed-circuit cells.

SUMMARY OF THE INVENTION

The present invention is based on a recognition by the present applicant that, with thin-film technology using at least some common films, it is possible to provide different diode types with different conduction characteristics in different closed-circuit cells of a ROM so as to increase the information content of the ROM, while retaining a thin-film device structure which may be manufactured by comparatively easy modification of known thin-film diode technologies.

In accordance with one aspect of the present invention there is provided a thin-film ROM device which comprises an array of open-circuit and closed-circuit cells formed on a substrate; each closed-circuit cell may comprise a thin-film diode; and the array may be formed from a stack of thin films carried on the substrate and including at least lower and upper semiconductor films of different conductivity type and/or conductivity between lower and upper electrode films. According to the present invention, such a thin-film ROM device is characterised in that only some of the closed-circuit cells comprise areas of both the upper and lower semiconductor films to form a first type of thin-film diode, and in that in others of the closed-circuit cells at least one of the semiconductor films is absent to form at least a second type of thin-film diode having a different conduction characteristic to that of the first type of diode.

It should be noted that it is known from U.S. Pat. No. 4,462,088 to form a ROM device in a silicon chip (i.e. as a monocrystalline-silicon monolithic integrated circuit), having different types of diode with different conduction characteristics so as to increase the information content of the ROM. Thus, some of the closed-circuit cells of the ROM of U.S. Pat. No. 4,462,088 comprise a Schottky barrier diode of high barrier height formed between an aluminium electrode and an underlying n type region of the silicon chip, other closed-circuit cells comprise a Schottky barrier diode of low barrier height formed between a different metal (tantalum or titanium) and an underlying n type region of the silicon chip, whereas further closed-circuit cells comprise a p type dopant implant or diffusion into the upper surface of an n type region so as to form a pn junction in the silicon chip.

Contrary thereto, the present invention involves forming different types of diode with a simple and inexpensive thin-film technology by stacking thin-films on a substrate and by omitting in some cell areas one of the semiconductor films from the stack of the lower electrode film, at least one lower semiconductor film, at least one upper semiconductor film and the upper electrode film. One preferred embodiment, in which this can be achieved very satisfactorily, involves first depositing the lower semiconductor film and then removing it from the lower electrode film in the cell areas where a second diode type is to be formed. This lower semiconductor film can normally be etched away readily from a metal-based electrode film using a selective etching technology.

Unlike the situation with monocrystalline silicon chips (as in the ROM of U.S. Pat. No. 4,462,088), Schottky barrier diodes with sufficiently different characteristics to form different logic states in a ROM device cannot readily be fabricated using thin-film technology. This is due to the high density of defect states in the bandgap of amorphous or polycrystalline semiconductor materials which form the thin films of thin-film Schottky diodes. These defect states dominate over the normal charge transfer mechanism from the conduction and valence bands and the effect of different metals for the Schottky electrode. However, as described below, various different types of thin-film diode may be used in a ROM device in accordance with the present invention, for example PIN diodes, MIN and/or MIP Schottky diodes, PN diodes, and even back-to-back NPN and/or PNP diodes. In these diode designations, P represents a semiconductor film with p type conductivity, N represents a semiconductor film with n type conductivity, I represents a semiconductor film with substantially intrinsic conductivity, and M represents a metal-based film. The electrode films are all normally metal-based. Each electrode film may comprise one or more layers and may be formed of a simple metal or metal alloy (for example, of tungsten, titanium, chromium, and/or aluminium) or as a metallic compound (for example, indium-tin oxide, or platinum silicide). Furthermore MIM diodes may be formed in which I represents a semi-insulating semiconductor-based film.

Thus, according to another aspect of the present invention, there is provided a method of manufacturing a thin-film ROM device; the method may comprise (a) successively depositing a plurality of thin films as a stack on a substrate, the films comprising a lower semiconductor film on a lower electrode film on the substrate, at least one upper semiconductor film on the lower semiconductor film, and an upper electrode film, the semiconductor films being of different conductivity type and/or conductivity, and (b) etching locally through the semiconductor films to define separate cell areas in the stack for an array of open-circuit and closed-circuit cells, each closed-circuit cell comprising a thin-film diode formed from the stack of semiconductor and electrode films. In accordance with the present invention at least one of the deposited semiconductor films is removed from some of the closed-circuit cell areas. Thus, this semiconductor film may be retained in areas where closed-circuit cells comprising a first type of thin-film diode are to be formed and may be removed from other closed-circuit cell areas before depositing the next film of the stack so as to provide in these other cell areas at least a second type of thin-film diode which has a different conduction characteristic to that of the first type. Three or more different types of diode may even be formed in this way.

In a preferred form, before depositing an upper semiconductor film, the lower semiconductor film is removed from the lower electrode film in areas where a second type of thin-film diode is to be formed. Thus, this second type may comprise an area of an upper semiconductor film directly on the lower electrode film, and a first type of thin-film diode in the same ROM device array may comprise an area of the lower semiconductor film directly on the lower electrode film. The lower electrode film can provide an effective etch-stop when removing the lower semiconductor film using a selective etching treatment.

However, it is also possible to remove an upper semiconductor film from a differently-doped semiconductor film, for example using a plasma etching treatment which can be monitored to detect the stage at which the lower semiconductor film starts to be removed. Mass spectroscopy or laser interferometry may be used for the monitoring. A particularly convenient technique to determine when the lower semiconductor film is exposed to the etching by removal of the upper semiconductor film involves monitoring the optical emission of the plasma during plasma etching. In this case the appearance or disappearance of emission bands of different dopants (such as phosphorus or boron) of the semiconductor layers can be clearly seen in the plasma and used to determine when the plasma etching of the thin-film semiconductor structure should be terminated.

Thin-film diode technology based on semiconductor films of hydrogenated amorphous silicon is well-established and is suitable for forming the different diode types (with some films common) in a ROM device in accordance with the present invention.

BRIEF DESCRIPTION OF THE DRAWING

These and other features in accordance with the invention are illustrated specifically in embodiments of the invention now to be described, by way of example, with reference to the accompanying diagrammatic drawing. In the drawing.

Figure 4:
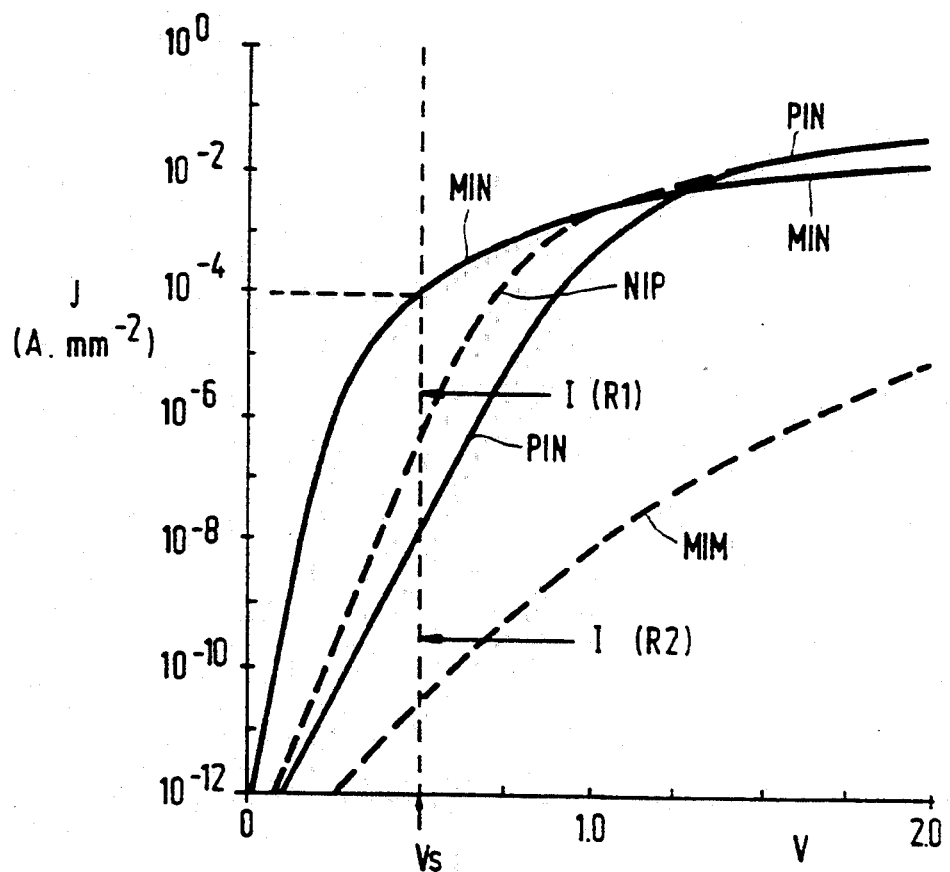
FIG. 4 is a plot of cell current density J on a logarithmic scale against applied voltage V between the electrode conductors of the cell for the two diode types of the cells of FIGS. 1 to 3.

It should be noted that all the drawings except FIG. 4 are schematic and not drawn to scale. Relative dimensions and proportions of parts of the device structures in the FIGS. have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 1:
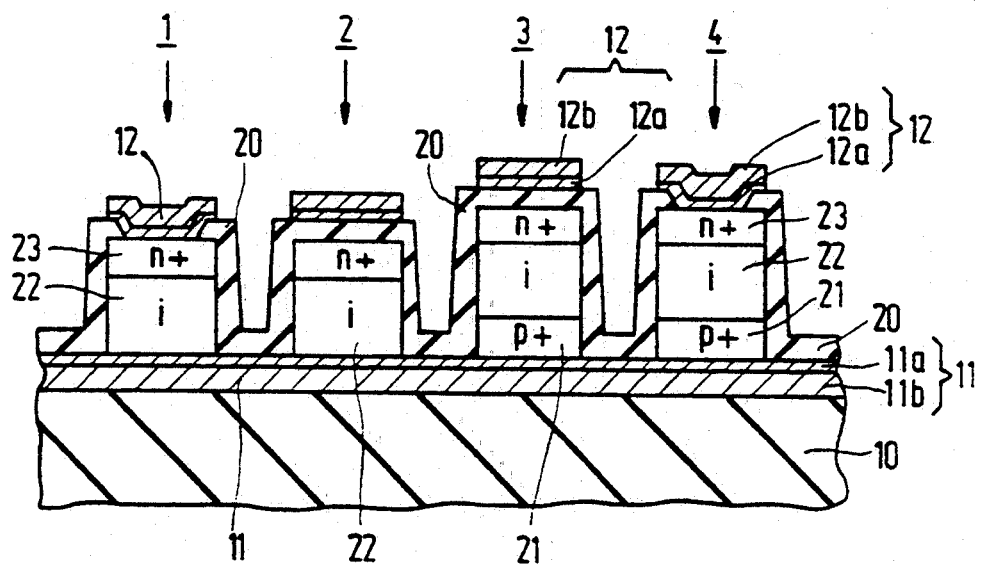
FIG. 1 is a cross-sectional view of four different thin-film diode cells in a ROM device in accordance with the invention, the view being taken on the line I—I of FIG. 2.
Figure 2:
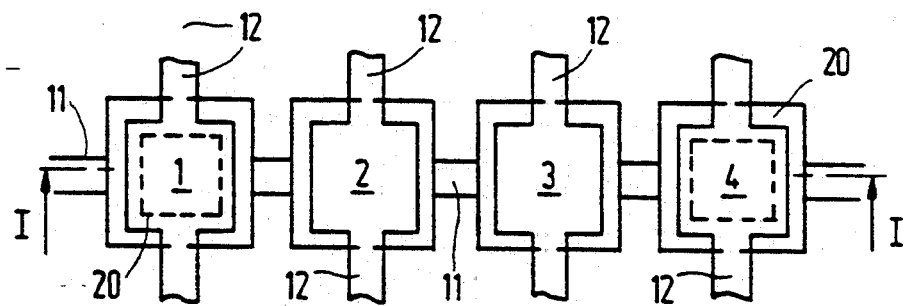
FIG. 2 is a plan view of the ROM cells of FIG. 1.
Figure 3:
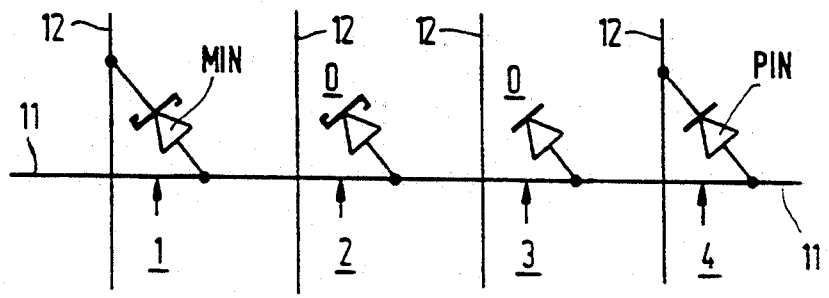
FIG. 3 is a circuit diagram of the ROM cells of FIGS. 1 and 2.

FIGS. 1 to 3 illustrate one example of four cells in a thin-film ROM device in accordance with the invention. The device comprises an array of open-circuit cells 2 and 3 and closed-circuit cells 1 and 4 formed on a substrate 10. Each closed-circuit cell comprises a thin-film diode (MIN and PIN for diodes 1 and 4 respectively) coupled between the transverse conductors 11 and 12 of the array. The array of cells are formed from a stack of thin films 11,21,22,23 and 12 carried on the substrate 10 and including a lower semiconductor film 21 on the lower electrode film 11, two upper semiconductor films 22 and 23 on the lower film 21, and an upper electrode film 12.

In accordance with the present invention only some of the closed-circuit cells (cell 4 in FIG. 1) comprise areas of both the upper and lower semiconductor films 21,22,23 to form a first type of diode (PIN in FIGS. 1 to 3), and in others of the closed-circuit cells (cell I in FIG. 1) at least one of the semiconductor films 21,22,23 is absent to form a second type of thin-film diode (MIN in FIGS. 1 to 3) having a different conduction characteristic (see FIG. 4) to that of the first type of diode. In the embodiment of FIGS. 1 to 3, it is the lower semiconductor film 21 which is absent in some cell areas, and the lower electrode film 11 forms a Schottky barrier with an area of the semiconductor film 22 in this second diode type. This particular construction facilitates manufacture as described below.

Although only one of the conductors 11 is actually shown in the views of FIGS. 1 and 2, the ROM array comprises two groups of parallel conductors 11 and 12 respectively which extend transverse to each other. At each cross-over point an area of the film stack 11,21,22,23,12 is present to form a mask-programmed storage cell holding one data bit. In the embodiment of FIGS. 1 to 3 an area of the film stack 11,21,22,23 is present even in the open-circuit cell areas 2 and 3, but this stack area is isolated from the upper conductor 12 by an insulating layer 20 between the films 12 and 23 so that the thin-film diode structures formed in these areas 2 and 3 are not coupled between the array conductors 11 and 12. However, it is possible to omit the films 21,22 and 23 in these open-circuit cell areas 2 and 3. In the closed-circuit cell areas 1 and 4 the films of the stack form diode elements MIN and PIN which are switchable into their conduction states by forward bias voltage levels applied to the ROM array conductors 11 and 12 by peripheral driving circuitry.

In a specific example of the embodiment of FIGS. 1 and 3, the thin-film ROM array is based on hydrogenated amorphous silicon technology to form the different diode structures. The substrate 10 may be of glass, or alumina, or any other suitable material having an insulating upper face which is suitable for the thin-film depositions and which has compatible thermal and mechanical properties. The conductor 11 may be a single layer of tungsten, chromium, zinc, titanium, molybdenum, nickel or an alloy of these materials. However the conductor 11 may be multi-layered. An upper surface layer 11a of, for example, one of the above metals forms an appropriate electrical contact to the overlying semiconductor and may be present on a thicker higher conductivity layer 11b of, for example, aluminium. The lower semiconductor film 21 may be of hydrogenated amorphous silicon heavily doped with boron so as to have a high p type conductivity (p+). The film 22 also of hydrogenated amorphous silicon may have little or no deliberate conductivity doping, so that the film 22 may have an effectively intrinsic conductivity with its Fermi level near the middle of the energy bandgap due to the defect states in the amorphous material. This intrinsic film 22 may be doped with nitrogen in order to reduce its photoconductivity. The film 23 may be of hydrogenated amorphous silicon heavily doped with phosphorus so as to have a high n type conductivity (n+). The sides and top of each separate cell area of the silicon film structure 21 to 23 may be passivated with a deposited layer of silicon dioxide 20, except where connection of the diodes is desired to the conductors 12. The conductor 12 (or at least a thick upper layer 12b) may be of aluminium or another metal. A layer 12a of a different material (for example, one of the above-mentioned metals) may be included between the top silicon film 23 and the conductor 12 so as to form a better appropriate contact to the underlying silicon. Alternatively, instead of a metal, one or more of the films 11,11a,12,12a may merely be metal-based, for example a deposited film of indium tin oxide (ITO) or a deposit of platinum which is alloyed with the adjacent silicon to form platinum silicide.

Therefore, in the specific example of FIGS. 1 to 3, the stacked films form a PIN diode in the cell area 4 where the electrode films 11 and 12 make ohmic contact to the heavily-doped p+ and n+ films 21 and 23 respectively, whereas a MIN Schottky diode is formed in the cell area 1 where the electrode film 11 makes a Schottky barrier with an area of the intrinsic film 22. The cell areas 2 and 3 are open circuit due to the presence of the silicon dioxide layer 20 between their film areas 12 and 23. FIG. 4 is a plot of the current-voltage forward characteristics for a particular example of these different cell areas 1 and 4. The voltage V is the voltage applied between the conductors 11 and 12 to forward bias the diode junctions sufficiently to turn on that particular cell 1 or 4. The resulting current density J (in the range of $10^{-12}$ A.mm$^{-2}$ to 1 A.mm$^2$) through the MIN and PIN diodes of these cells 1 and 4 is plotted in FIG. 4 over a range of forward voltage V from 0 volts to 2 volts. Similar characteristics are not obtained for the cells 2 and 3 which remain firmly open circuit when these bias voltages are applied to their conductors 11 and 12. Only a negligible displacement current occurs in the silicon diode layer 20 of the cells 2 and 3, and this negligible current (less than 10-12 amps. mm$^{-2}$) was too small to measure and plot in FIG. 4. Neither does FIG. 4 show the reverse characteristics of the MIN and PIN diodes of cells 1 and 4 which are obtained by applying bias voltages of the opposite polarity, but these reverse characteristics are leakage currents of less than about $10^{-10}$ for the MIN diode and less than about $10^{31}$ 12 A.mm$^{-2}$ for the PIN diode over a voltage range of 0 to 5 volts.

The difference in forward characteristics of the diodes MIN and PIN of FIG. 4 can be seen by measuring the current density J through the respective cell when applying a given bias voltage Vs between its conductors 11 and 12. Thus, in a specific example using a voltage Vs of 0.5 volts, the current levels through the different cells are of the order of $10^{-4}$ A.mm$^{-2}$ for the MIN diode in cell 1, and of the order of $10^{-8}$ A.mm$^{-2}$ for the PIN diode in cell 4, and less than $10^{-12}$ A.mm$^{-2}$ for the open-circuit cells 2 and 3. These three current levels can be used to give three different logic levels in the ROM array, instead of the two logic levels in the ROM array of GB-A-2 066 566. Thus, the density of information stored in the ROM device of FIGS. 1 to 3 can be increased by approximately 50% (as compared with the ROM device of GB-A-2 066 566) by using these three options for the cross-overs, namely the two different thin-film diode types MIN and PIN and an open circuit 0. By using a third diode type (e.g. a back-to-back diode, or a MIM) as well as the open circuit option, the information content of the ROM device can be increased 100%.

Figure 5:
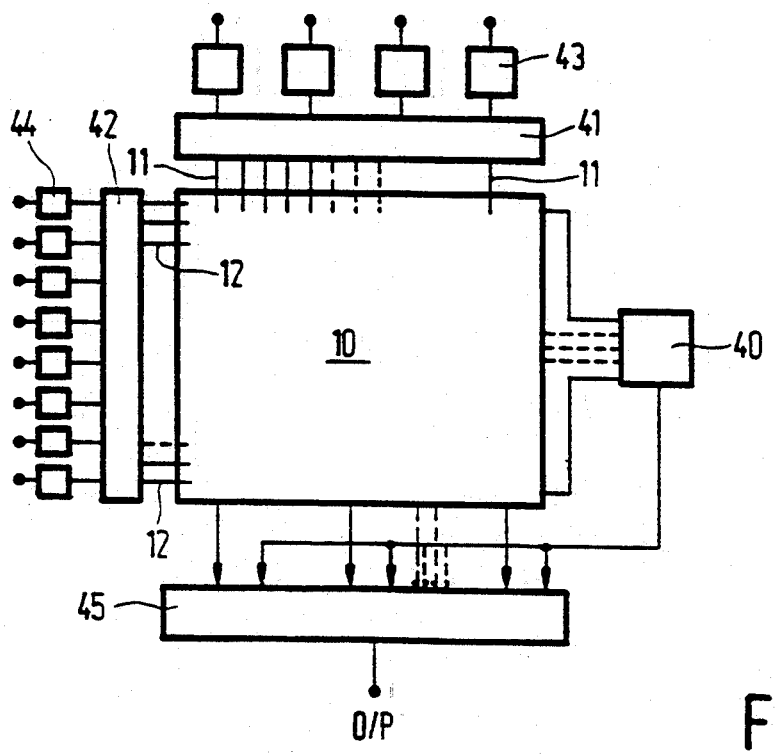
FIG. 5 is a circuit block diagram illustrating one possible example of addressing and read-out circuitry for a ROM array comprising the cells of FIGS. 1 to 3.

It can be seen from the characteristics of FIG. 4, that there are several positions on the curves where the characteristics are sufficiently different to allow discrimination of different logic levels. The lines in FIG. 4 illustrate reading the cells with a given voltage bias level Vs and comparing the current through the cells with reference current levels I(R1) and I(R2) to determine the logic level corresponding to 0, PIN, or MIN. For the characteristics of FIG. 4 and with Vs of 0.5 volts, I(RI) may be chosen to correspond to a current density between $10^{-5}$ and $10^{-6}$ A.mm$^{-2}$ to distinguish MIN from both PIN and 0, and I(R2) may be chosen to correspond to a current density between $10^{-10}$ and $10^{-9}$ to distinguish 0 from both MIN and PIN. However, the conductors 11 and 12 of the thin-film ROM array of FIGS. 1 to 3 may be connected to external circuitry using a constant current source, and different voltage levels may then be sensed in a similar manner to that described in U.S. Pat. No. 4,462,088. Such a system configuration is illustrated very schematically in FIG. 5. The thin-film ROM circuit with conductors 11 and 12 on substrate 10 is connected to peripheral circuitry 40 to 45 which may be formed in a conventional manner by monolithic integrated circuit technology As monocrystalline silicon chips. By way of example, circuit blocks 41 and 43 represent a bit-line decoder and bit address circuits respectively, circuit blocks 42 and 44 represent a word-line decoder and word address circuits respectively, circuit block 40 represents a reference-voltage circuit, and circuit block 45 represents sense amplifier and output circuitry providing a data output O/P.

Figure 6:
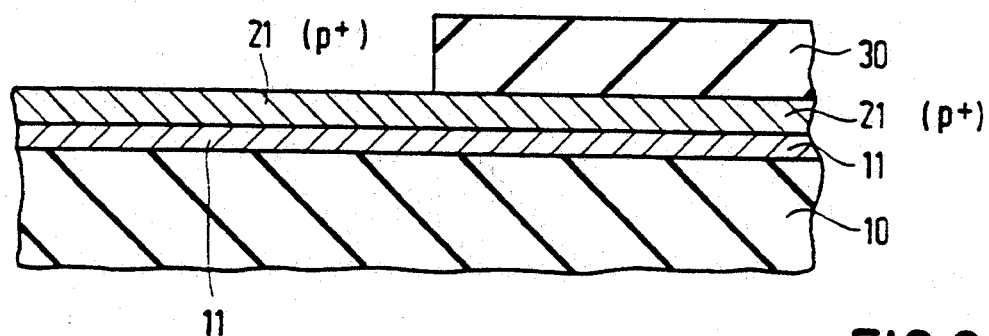
FIGS. 6 and 7 are cross-sectional views of the device structure of FIG. 1 at two stages during its manufacture by a method in accordance with the invention.
Figure 7:
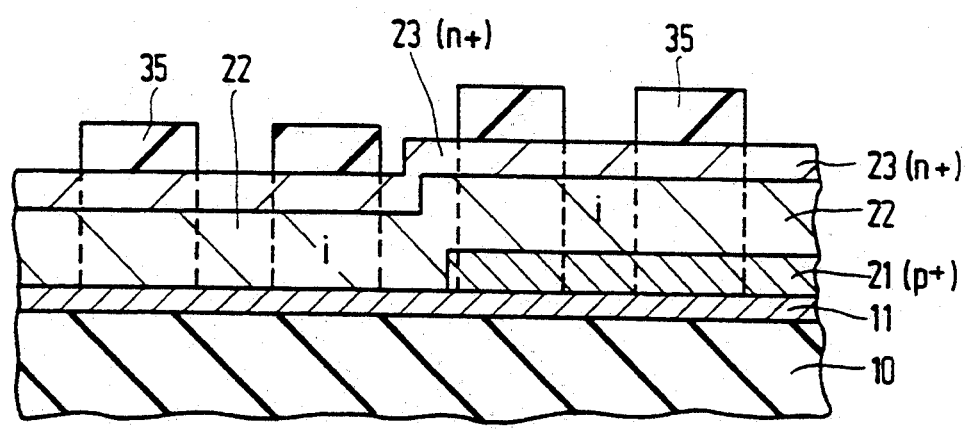

FIGS. 6 and 7 illustrate two stages in the manufacture of a ROM device having cells as in the specific example of FIGS. 1 to 3. Chromium or another suitable metal is deposited on the substrate 10 to form a continuous layer 11 which may have a thickness of about 200 nm. By a photolithographic and etching process, this layer is shaped into the separate parallel conductors 11 for each column of the array. A continuous p+ amorphous silicon film 21 having a thickness in the range of 20 to 50 nm is then deposited by a chemical vapour deposition process from a gas stream of silane (SiH4) with diborane B$_2$H$_6$. Either a low pressure (LP) CVD process or a plasma-enhanced (PE) CVD process may be used to deposit the film 21 (and also the subsequent films 22 and 23). With LPCVD, the temperature of the sustrate 10 may be, for example, about 525° C. With PECVD, the substrate temperature can be much lower, for example about 300° C., and the gas stream may comprise a hydrogen gas supply as well as the silane.

As shown in FIG. 6, the areas where the p+film 21 is required for the PIN thin-film diodes is then masked, for example with photoresist 30, and the exposed p+film areas are removed by etching with, for example, a chemical etching solution of KOH, or HF and HNO$_3$ or catechol, or by plasma etching using, for example, freon with oxygen. Because the metal electrode film 11 is not removed so readily by these etchant treatments, it forms an etch-stop and so it is comparatively easy to etch away the p+film reliably from the metal conductors 11 and 11a and from the substrate 10 in the exposed areas. Many etching processes are highly selective between amorphous silicon and metal.

Subsequently the intrinsic silicon film 22 and n+silicon film 23 are deposited by LPCVD or PECVD, phosphine PH$_3$ being introduced into the gas stream for the deposition of the n+film 23. The film 22 may have a thickness in the range of 200 to 700 nm, while the film 23 may be between 20 and 50 nm thick, for example. A photolithographic step is then carried out to form photoresist masks 35 over the cell areas, as shown in FIG. 7. The FIG. 7 structure is then subjected to an etching treatment to etch locally through the stack of silicon films 23,22,21 so as to leave separate areas corresponding to the array of open-circuit and closed-circuit cells. This local removal of films 23,22,21 is indicated by broken lines in FIG. 7. Each cell may typically be less than 10 μm square, for example an area of 7 μm by 7 μm each.

The silicon dioxide layer 20 is then deposited, and contact windows for the MIN and PIN diodes of cell 1 and 4 are formed in a photolithographic and etching step. The layer 20 may have a thickness of, for example, between 0.4 μm to 1.2 μm. Finally, aluminium and/or another metal is deposited, for example to a thickness of between 0.4 μm and 1 μm and the resulting electrode film is patterned in a photolithographic and etching step to form the parallel conductors 12. It is normally desirable to include a different contact layer 12a in the electrode film 12 below the aluminium, and such a layer 12a may be for example chromium having a thickness of about 20 nm.

Figure 8:
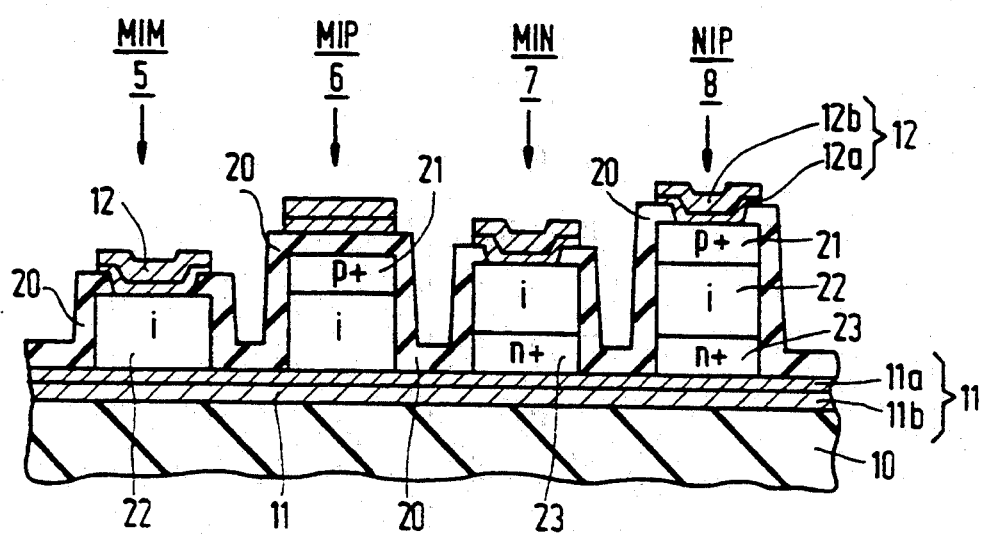
FIG. 8 is a cross-sectional view similar to that of FIG. 1, illustrating four other diode structures in a ROM device also in accordance with the invention.

It will be evident that many modifications and variations are possible within the scope of the present invention. Thus, for example, FIG. 8 illustrates four different thin-film diode structures having different conduction characteristics but all formed from a common stack of thin films. In this example, the stack comprises the highly conductive n type silicon film 23 on the lower electrode film 11a at the bottom stack, the intrinsic silicon film 22 on the n+film 23, and the p+silicon film 21 on the intrinsic film 22. In cell area 8, all three silicon films are retained so forming a NIP diode connected between the conductors 12 and 11. Such an NIP diode has a similar forward characteristic to the PIN diode of FIGS. 1 to 3, as illustrated by the particular example (broken line) NIP in FIG. 4. In cell areas 5 and 6, the n+film 23 was removed, similar to the removal of the p+film 21 in the embodiment of FIGS. 1 and 6. Thus, in cell area 6, the intrinsic silicon film 22 contacts the electrode film 11 to form a Schottky barrier. By contacting the p type film 21 with the upper electrode 12, a MIP Schottky diode is provided in the cell area 6. However, by way of example, FIG. 8 shows the area 6 as an open-circuit cell in which the MIP structure is separated from the conductor 12 by the insulating layer 20.

Although it is generally easier to etch away a silicon film (21 or 23) from a metal film (11,11a), the Applicant finds that etchant treatments can be used to etch away one silicon film from another silicon film having either different doping or different crystal structure. Thus, for example, using a wet etchant solution, an amorphous silicon film with phosphorus doping or with intrinsic conductivity can be etched at about 20 times the rate of an amphorous silicon film with heavy boron doping and so can be removed fairly reliably in this manner from a highly boron-doped film. It is also possible to monitor the etching treatment and so to stop the etching at the appropriate stage. This monitoring can be carried out most conveniently with plasma etching. Thus, by monitoring for the disappearance of a boron emission band in the plasma, an amorphous silicon film 21 with heavy boron doping can be etched away from an intrinsic amorphous silicon film 22 (and even from an n type silicon film 23). This etching treatment has been carried out in the cell areas 5 and 7 of FIG. 8, while masking the other areas with photoresist. Thus, in cell area 7, the electrode film 12 contacts the intrinsic silicon film 22 to form a Schottky barrier, and so a MIN Schottky diode is present in the cell area 7. CF$_4$ with O$_2$, or CF$_2$Cl with O$_2$ and SF$_6$ may be used for the plasma etching. By monitoring for the appearance of a phosphorus emission band, the intrinsic film 22 may be plasma-etched from the n+film 23, and so a PN diode can be formed in some cell areas if desired.

In the cell area 5, both the p+ and n+ films 21 and 23 are absent so that the intrinsic silicon 22 is contacted by both the metal electrode films 11a and 12. The film 22 may be an alloy of silicon with another element, for example nitrogen and/or carbon, which provides the film 22 with semi-insulating conducting properties so that a MIM diode structure is formed. As already mentioned the intrinsic silicon film 22 in the embodiment of FIG. 1 may be doped with nitrogen to reduce photoconductivity. In the FIG. 8 embodiment, the nitrogen or carbon doping concentration in the film 22 is increased sufficiently to give a desired non-linear conduction characteristic for the MIM diode, while still providing satisfactory Schottky and NIP diode characteristics in the cell areas 6 to 8. A particular example of the forward characteristic of such a MIM diode is illustrated in FIG. 4.

More than one n type (or p type) film may be included in the thin-film stack. Thus, in some of the cell areas, back-to-back diodes may be formed, for example with a PNP, or PINIP, or NPN or NIPIN structure. In other cell areas of the ROM, some of these films may have been etched away so as to leave a single diode structure in that area, for example a NP, or NIP or PN or PIN diode structure. In yet further cell areas of the same ROM, Schottky barrier diodes and open-circuit cells may be formed as described above.

An EEPROM with the different diode types in its memory array in accordance with the invention may also be formed by including in the film stack a thin film of reversible phase-charge amorphous material between the upper electrode film 12 and the uppermost semiconductor film.

Thin-film ROM devices manufactured in accordance with the present invention may be designed for use in a variety of applications, for example as a computer programme store, or as a programme memory for equipment control, or as a personal information store, or as a store for audio and/or video data.

From reading the present disclosure, other variations and modifications will be apparent to persons skilled in the art. Such variations and modifications may involve equivalents and other features which are already known in the design, manufacture and use of thin-film devices, and ROMs and other semiconductor memories and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A thin-film ROM device comprising an array of laterally separated open-circuit and closed-circuit cells formed on a substrate, each closed-circuit cell comprising a thin-film diode, the array being formed from a stack of thin films carried on the substrate and including at least lower and upper semiconductor films of different conductivity type and/or conductivity between lower and upper electrode films, characterised in that only some of the closed-circuit cells comprise both the upper and lower semiconductor films to form a first type of thin-film diode, and in that in others of the closed-circuit cells at least one, but not both, of the semiconductor films is absent to form at least a second type thin-film diode having a different conduction characteristic than that of the first type of diode.

2. A device as claimed in claim 1, further characterized in that the lower semiconductor film is absent in one second type of diode, the lower electrode film of which forms a Schottky barrier with the upper semiconductor film in this diode.

3. A device as claimed in claim 2, further characterized in that a further semiconductor film is present between the upper semiconductor film and the upper electrode in at least some of the closed-circuit cells, of the first type of thin film diode and in that both the further semiconductor film and the lower semiconductor film have a high conductivity-determining doping concentration as compared with the upper semiconductor film.

4. A device as claimed in claim 3, further characterized in that the lower and further semiconductor films are of opposite conductivity type and the upper semiconductor film is substantially intrinsic so that some closed-circuit cells comprise PIN diodes and other closed-circuit cells comprise PIM or NIM diodes where M represents a metal-based electrode film forming a Schottky barrier with the substantially intrinsic semiconductor film.

5. A device as claimed in claim 1, further characterized in that the upper semiconductor film is an alloy of a semiconductor element with another element which provides the film with semi-insulating conductive properties, and in that the lower semiconductor film is absent in one second type of diode which has a MIM structure comprising the semi-insulating upper semiconductor film (represented by I) between metal-based upper and lower electrode films.

6. A device as claimed in claim 1, further characterized in that the open-circuit cells comprise an insulating layer between the upper electrode film and the semiconductor films.

7. A device as claimed in claim 1 wherein the electrode films are metal based.

* * * * *